United States Patent [19]
Bernard et al.

[11] Patent Number: 5,627,483
[45] Date of Patent: May 6, 1997

[54] EMITTER COUPLED LOGIC CIRCUIT WITH MOS DIFFERENTIAL STAGE

[75] Inventors: Patrick Bernard, Poisat; Didier Belot, Rives; Jacques Quervel, Montbonnot Saint Martin, all of France

[73] Assignee: SGS-Thomson Microelectronics S.A., Saint Genis, France

[21] Appl. No.: 521,518

[22] Filed: Aug. 30, 1995

[30] Foreign Application Priority Data

Aug. 31, 1994 [FR] France ................. 94 10633

[51] Int. Cl.⁶ .................................. H03K 19/003
[52] U.S. Cl. .................................. 326/110; 326/127
[58] Field of Search .................. 326/110, 126, 326/127

[56] References Cited

U.S. PATENT DOCUMENTS

| | | | |
|---|---|---|---|
| 4,737,663 | 4/1988 | Varadarajan | 326/126 |
| 4,918,640 | 4/1990 | Heimsch et al. | 364/768 |
| 4,999,519 | 3/1991 | Kitsukawa et al. | 326/126 X |
| 5,043,602 | 8/1991 | Flannagan | 326/126 |
| 5,124,580 | 6/1992 | Matthews et al. | 326/126 X |
| 5,124,588 | 6/1992 | Baltus et al. | 307/465 |
| 5,287,016 | 2/1994 | Dansky et al. | 307/446 |
| 5,485,110 | 1/1996 | Jones et al. | 326/126 X |

OTHER PUBLICATIONS

French Search Report from French Patent Application No. 9410633, filed Aug. 31, 1994.
Patent Abstracts of Japan, vol. 16, No. 288 (E [1223]) Jun. 25, 1992 & JP-A-04 072916 (Hitachi).

*Primary Examiner*—David R. Hudspeth
*Attorney, Agent, or Firm*—David M. Driscoll; James H. Morris; Brett N. Dorny

[57] ABSTRACT

A logic circuit has at least one first differential stage made of bipolar transistors operating in linear mode. The first differential stage is connected in a branch of a second differential stage biased by a current source. The second stage and the current source are made of MOS transistors.

34 Claims, 3 Drawing Sheets

EMITTER COUPLED LOGIC CIRCUIT WITH MOS DIFFERENTIAL STAGE

BACKGROUND OF THE INVENTION

1. Field of the Invention

The present invention relates to logic circuits of the type comprising differential stages operating in linear mode, such as Emitter-Coupled Logic (ECL) circuits.

2. Discussion of the Related Art

ECL circuits are ones of the fastest logic circuits. To reach a high operation speed, ECL circuits are designed so that their bipolar transistors never go to saturation mode. Bipolar transistors saturate when their collector-emitter voltage Vce is lower than their base-emitter voltage Vbe. In such an instance, the base has a substantially higher capacity as compared to an instance in which the transistor operates in the linear mode, which causes conventional bipolar circuits to be slow. To prevent transistors from saturating, the transistors are connected in differential stages, hence the "emitter-coupled" terminology. Thus, differential signals are generally processed by ECL circuits, each component of a differential signal being applied to a respective input of a differential stage.

FIG. 1 represents an exemplary conventional ECL circuit, in this example a multiplexer. All the transistors of the ECL circuits are of the bipolar NPN-type. A first complementary signal A/A* is applied to the inputs of a first differential stage formed by a pair of transistors Q1 and Q2. The collectors of transistors Q1 and Q2 are connected to a high supply voltage Vcc through respective resistors Rc. The resistors Rc are mounted in the branches of the differential stage Q1, Q2. A second differential signal B/B* is applied to the inputs of a differential stage formed by a pair of transistors Q3 and Q4. The two branches of stage Q3, Q4 are connected to the branches of stage Q1, Q2, respectively.

Stages Q1, Q2, and Q3, Q4 are respectively connected in the branches of a differential stage formed by a pair of transistors Q5 and Q6, i.e., the collector of transistor Q5 is connected to the emitters of transistors Q1 and Q2, and the collector of transistor Q6 is connected to the emitters of transistors Q3 and Q4. Stage Q8, Q6 is biased through a supply source formed by a transistor Q7 whose emitter is connected to a low supply voltage GND (ground) through a resistor Re1, and whose collector is connected to the emitters of transistors Q5 and Q6. A reference voltage Vr applied to the base of transistor Q7 determines the biasing current of stage Q5, Q6. A differential selection signal S/S* is applied to the inputs of stage Q5, Q6 through follower-connected transistors Q8 and Q9.

The output of the logic circuit is a differential signal D/D* drawn from the branches of stage Q1, Q2 through follower transistors Q10 and Q11.

The follower transistors Q8–Q11 are respectively biased by transistors Q12–Q15 that are connected to emitter resistors (Re2 for transistors Q12, Q13 and Re3 for transistors Q14 and Q15) like transistor Q7.

The multiplexer operates as follows. If the differential signal S/S* is high (i.e., components S and S* are respectively high and low), transistor Q5 is conductive and transistor Q6 is blocked. Stage Q3, Q4 is then inactive; only stage Q1, Q2 imposes the value of signal A/A* to the output D/D* Conversely, if signal S/S* is low, signal B/B* ms present at output D/D*.

The follower transistors Q8 and Q9 are necessary to prevent transistors Q5 and Q6 from saturating. For example, if components A and S are at the same state, the collector and base voltages of transistor Q5 are equal, which ensures that the collector-emitter voltage of transistor Q5 is at least equal to the base-emitter voltage Vbe of transistor Q5. In the absence of the follower transistor Q8, the collector-emitter voltage of transistor Q5 would be substantially zero, causing transistor Q5 to saturate.

ECL signals have a small range, i.e., the voltage difference between the high state and the low state of a component of an ECL signal is small. This small range, approximately 0.5 volt, increases the rapidity of the logic circuit by decreasing the charge and discharge energy of any parasitic capacitances.

To determine the change over time of an ECL signal the emitter voltage (D*) of transistor Q10, for example, is considered. If transistors Q1 and Q4 are blocked, this voltage is substantially equal to Vcc-Vbe. If transistors Q1 and Q5 are conductive, the voltage drops by a value Vs, corresponding to the ECL range, equal to the product of the current in transistor Q7 by the resistance Rc. Accordingly, the voltage at the output D* varies from Vcc-Vbe to Vcc-Vbe-Vs. The circuit of FIG. 1 is designed to be connected through one of its input (A/A* B/B* S/S*) to the output (D/D*) of another similar circuit. The range Vs being fixed (approximately 0.5 volt), the voltage Vcc should be high enough so that the minimum value of the output of the other circuit does not cause transistors Q1, Q5, Q7 or Q8, Q5, Q7, for example, to saturate. Thus, the minimum voltage of output D* is equal to the sum of three voltages Vbe (of transistors Q1 or Q8, and Q5 and Q7, for example) and of a voltage Vr-Vbe occurring across the emitter resistor Re of transistor Q7. Therefore, the minimum voltage is 2Vbe+Vr. Therefore, the supply voltage Vcc should be such that:

Vcc−Vbe−Vs>2Vbe+Vr.

For typical values Vs=0.5, Vbe=0.9, Vr=1.2, voltage Vcc should be at least equal to to 4.4 volts. An ECL circuit is typically supplied at 5 volts.

A drawback of ECL circuits is their high current consumption due to the fact that the currents supplied by the current sources are always consumed by the follower transistors or by either one of the other branches of a differential stage. If the supply voltage Vcc could be decreased, the current consumption would be decreased by the same extent.

SUMMARY OF THE INVENTION

An object of the present invention is to fabricate a differential stage logic circuit whose supply voltage is particularly low.

A further object of the present invention is to fabricate such a logic circuit consuming a particularly low current.

These objects are achieved according to an embodiment of the present invention by replacing specific bipolar transistors of the logic circuit with MOS transistors.

An illustrative embodiment of the present invention more particularly relates to a logic circuit comprising at least one first differential stage made of bipolar transistors operating in linear mode. The differential stage is mounted in a branch of a second differential stage biased by a current source, in which the second stage and the current source are made of MOS transistors.

According to an embodiment of the invention, the gates of the MOS transistors of the second stage directly form logic circuit inputs.

According to an embodiment of the invention, the current source comprises a MOS transistor whose source is directly connected to a supply voltage.

A multiplexer according to the invention comprises two first stages whose corresponding branches are interconnected, these two stages being respectively connected in the branches of the second stage.

A logic gate according to the invention includes a first stage connected to a first branch of the second stage, the second branch of the second stage being connected to a branch of the first stage.

According to an embodiment of the invention, the bipolar transistors are NPN transistors and the MOS transistors are N-channel transistors.

The foregoing and other objects, features, aspects and advantages of the invention will become apparent from the following detailed description of the present invention when taken in conjunction with the accompanying drawings.

DETAILED DESCRIPTION

A differential stage logic circuit according to an illustrative embodiment of the invention generally comprises a first level of differential stages formed by NPN bipolar transistors. In contrast, a second level of differential stages, comprising in their branches differential stages of the first level, is formed by N-channel MOS transistors. Similarly, the biasing current sources of the stages of the second level and of the follower transistors are also formed by N-channel MOS transistors.

Figure 1:
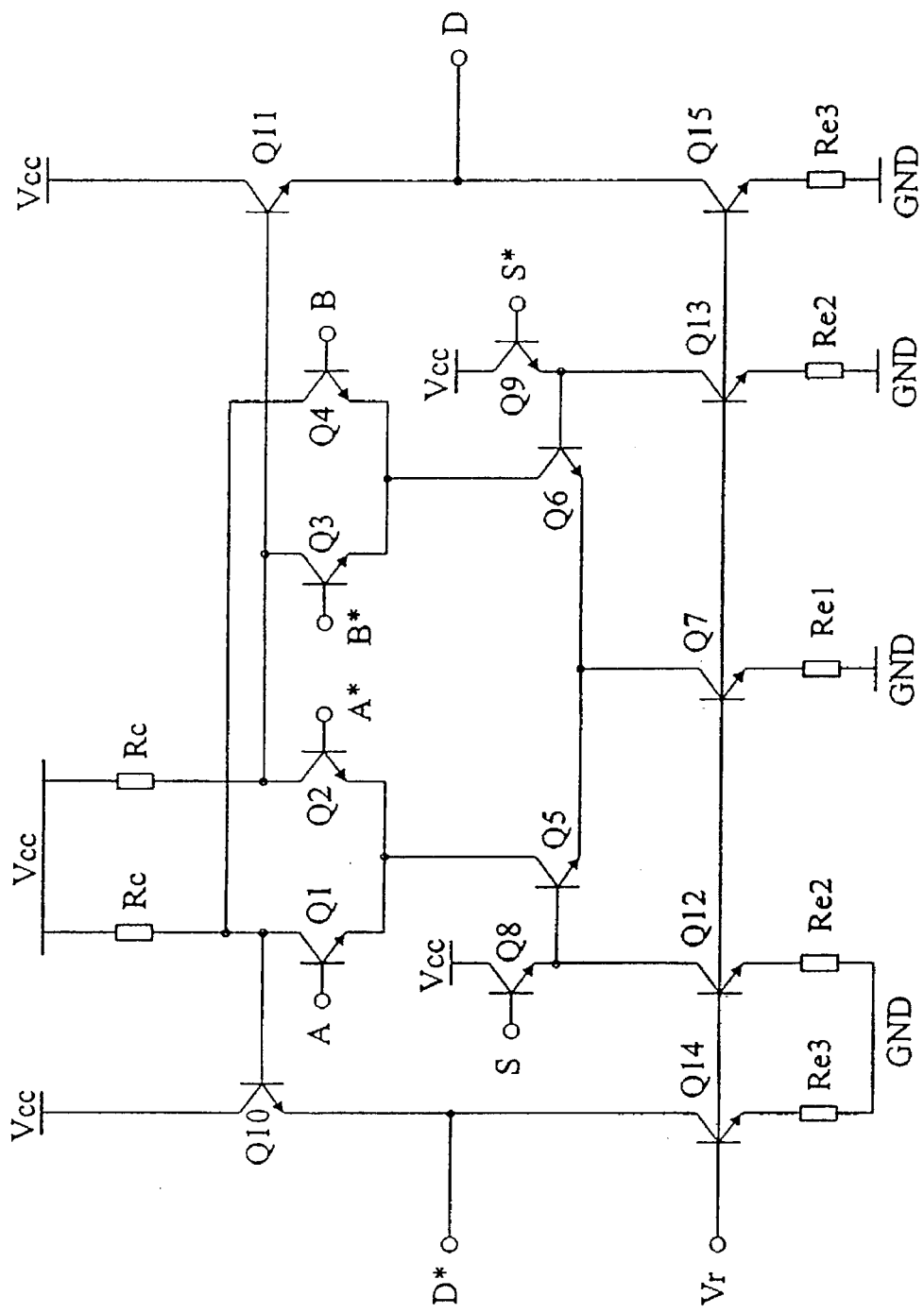
FIG. 1, above described, represents a conventional ECL circuit.
Figure 2:
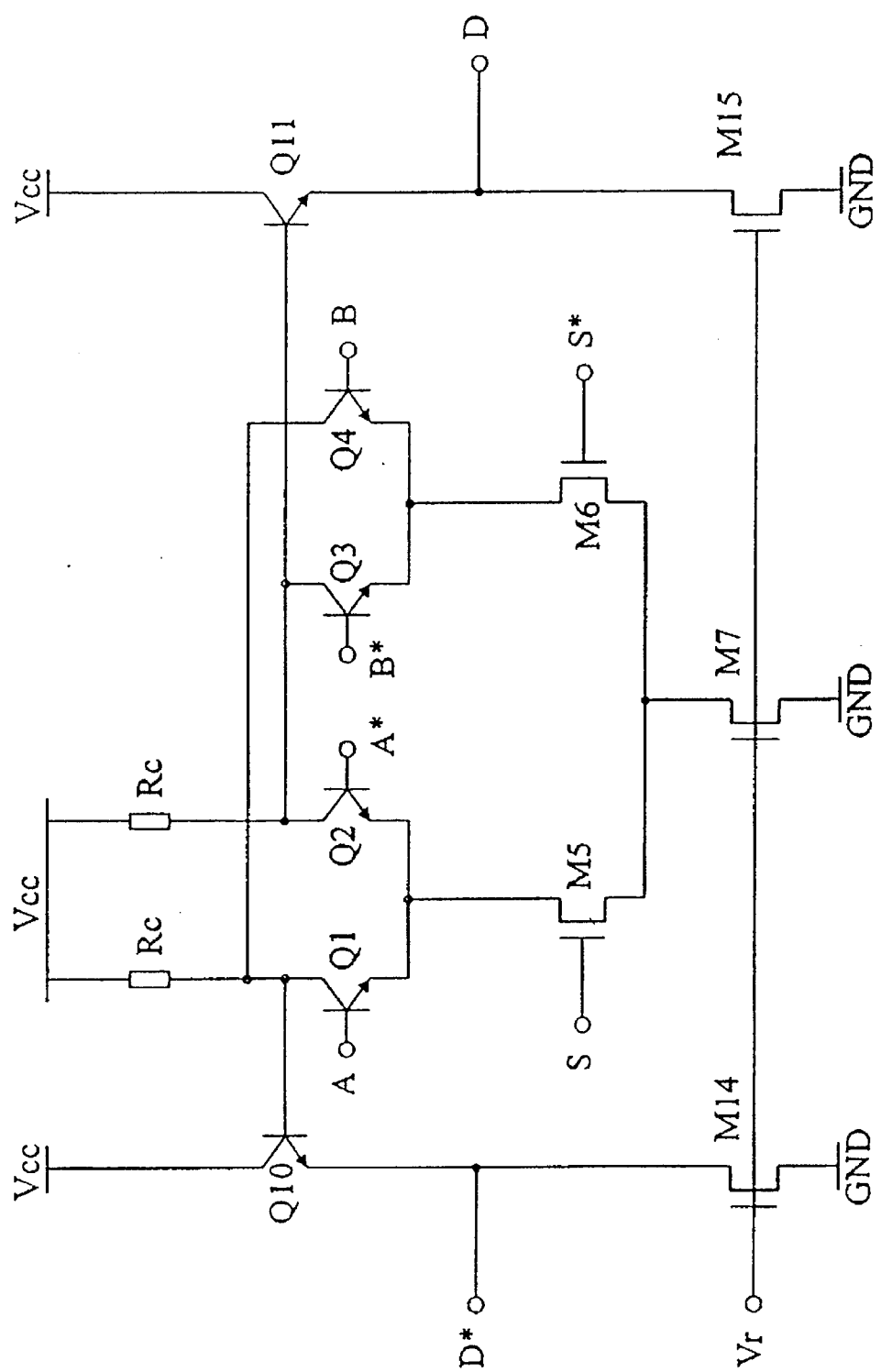
FIG. 2 represents an exemplary logic circuit with differential stages according to the present invention.

FIG. 2 illustrates an exemplary logic circuit fabricated according to an embodiment of the present invention. The circuit of FIG. 2 is a multiplexer of the same type as that of FIG. 1, and the same elements as in FIG. 1 are designated with the same references. In FIG. 2, the differential stage Q5, Q6 of FIG. 1 is replaced with a differential stage including MOS transistors M5 and M6. Similarly, the current sources constituted by transistors Q7, Q14, and Q15, as well as the associated emitter resistors Re of FIG. 1, are replaced with MOS transistors M7, M14, and M15, which are directly connected to ground GND. In addition, the stage M5, M6 can directly receive the differential signal S/S*, without it being necessary to provide follower transistors and corresponding biasing sources (Q8, Q9, Q12, and Q13 in FIG. 1). Accordingly, the current consumption of the circuit is decreased by suppressing as many pairs of biasing sources as MOS differential stages.

The gate-source threshold voltage Vt of a MOS transistor plays the same role as the base-emitter voltage Vbe of a bipolar transistor. Thus, it could be assumed, from calculations carried out for the circuit of FIG. 1, that the minimum voltage Vcc is 2Vt+2Vbe+Vs. This value would be higher than the minimum voltage Vcc calculated for the circuit of FIG. 1 (with the typical values Vs=0.5, Vbe=0.9, and Vt=1.2 V). However, an aspect of the present invention has been to note that the fact that the drain-source voltage of a MOS transistor is lower than the threshold voltage Vt is not an impairment. Indeed, the gate capacitance of the MOS transistor does not vary. The only, not impairing, difference is that the MOS transistor turns to a resistive operating mode, during which the drain-source resistance varies as a function of the gate-source voltage. Practically, this drain-source voltage in resistive mode, referred to as Von, does not exceed 0.3 volt.

Therefore, the minimum voltage Vcc is expressed by 2Vbe+2Von+Vs which is approximately 2.9 volts using the above-mentioned typical values. A logic circuit according to the invention is particularly well adapted for integration in a 0.7-micron technology which withstands a supply voltage of approximately 3.3 volts.

Also, the minimum voltage Vcc may be calculated with respect to the voltage to be applied to the gates of transistors M5 and M6. This minimum voltage is then Vbe+Vt+Von, where Vt is the threshold voltage of transistors M5 and M6, and Von is the drain-source voltage of transistor M7. The minimum voltage Vcc is substantially equal to the voltage previously calculated, because voltage Vt is substantially equal to Von+Vbe.

Follower transistors need not precede transistors M5 and M6 as in FIG. 1. For example, if the components A and S are at the same voltage, the drain-source voltage of transistor M5 is equal to Vt-Vbe, i.e., approximately Von.

In addition, transistors M7, M14, and M15 need not be provided with source resistors. In FIG. 1, emitter resistors were provided to compensate for differences between the transistor base-emitter voltages and voltage drops between the emitters caused by relatively high currents flowing through the conductors connecting the emitters. Bipolar transistors have a high transconductance. So, in the absence of emitter resistors, a low difference between the base-emitter voltages of two of the transistors of the current source could cause a significant difference between the collector currents of the bipolar transistors. In contrast, MOS transistors have a low transconductance, which allows the suppression of source resistors.

Since MOS transistors have a lower transconductance than bipolar transistors, the size of transistors M5 and M6 are typically relatively large so that the transconductance of the MOS transistors has the same order of magnitude as the transconductance of the bipolar transistors Q5 and Q6 of FIG. 1. This increase in size is not impairing because it is compensated for by the fact that the follower transistors Q8 and Q9, the corresponding biasing sources, and the emitter resistors of FIG. 1 are omitted. The increase in the size generally causes an increase in the gate capacitance of the MOS transistors. However, the possible resulting speed decrease is compensated for by increasing the biasing current of the MOS transistor stages. This current increase is not impairing since many biasing sources (Q12, Q13) have been omitted and, furthermore, this still increases the MOS transistor transconductance.

In the embodiments shown, MOS transistors have not been substituted for bipolar transistors Q1–Q4 because, if the voltage Vcc is selected at its minimum value, the maximum gate-source voltage of the MOS transistors would be approximately Vbe+Vs, which not substantially exceeds the threshold voltage Vt of a MOS transistor. A MOS transistor would be hardly conductive and could only partially transmit the current of the differential stage to its corresponding branch. In contrast, value Vbe+Vs is highly sufficient to render a bipolar transistor entirely conductive.

Of course, the invention is not limited to the multiplexer circuit of FIG. 2 which is given by way of example only.

Figure 3:
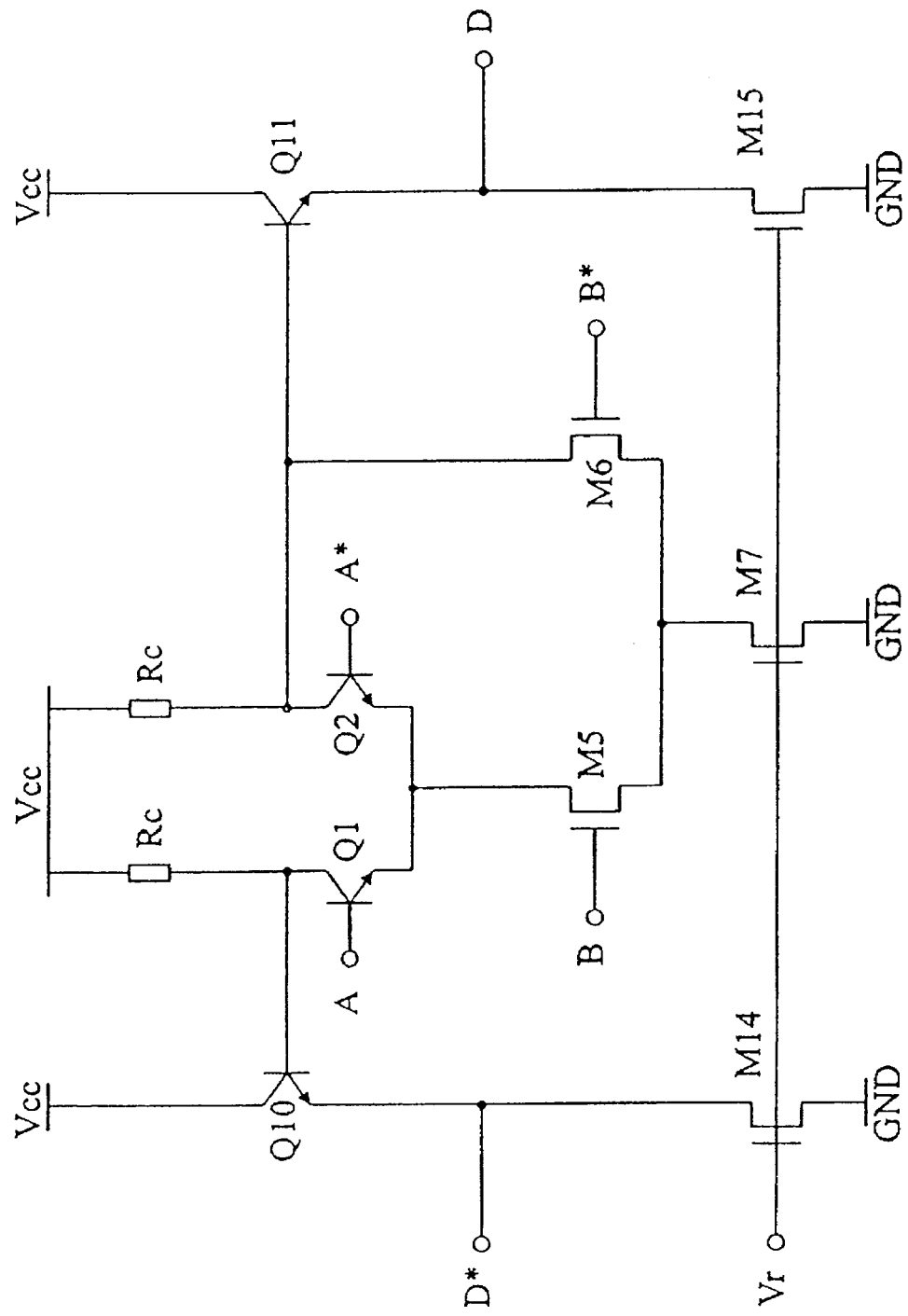
FIG. 3 represents another exemplary logic circuit according to the present invention.

FIG. 3 illustrates another exemplary logic circuit according to the invention, in this case an AND gate (or NAND gate depending on whether outputs D/D* are inverted). A first differential signal A/A* is applied to the inputs of a stage comprising transistors Q1 and Q2 that are connected like transistors Q1 and Q2 of FIG. 2 to collector resistors Rc and to output transistors Q10 and Q11. The stage Q1, Q2 is connected in one branch of a differential stage made of MOS transistors M5 and M6, whose other branch (drain of transistor M6) is connected to the collector of transistor Q2. The stage M5, M6 receives a differential signal B/B* and is biased through a MOS transistor M7 like stage M5, M6 of FIG. 2.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A logic circuit comprising:
   a first differential stage including a plurality of bipolar transistors operating in a linear mode, each of the plurality of bipolar transistors having a base terminal, a collector terminal, and an emitter terminal, each of the emitter terminals being coupled together;
   a second differential stage having a branch that is coupled to the emitter terminals of the first differential stage, the second differential stage including MOS transistor having a gate terminal, a source terminal and a drain terminal; and
   a current source coupled to the second differential stage, that biases the first differential stage so that each of the plurality of bipolar transistors operate in the linear mode, the current source including MOS transistors;
   wherein gates of the MOS transistors of the second stage receive the same voltage levels as the base terminals of the bipolar transistors of the first stage.

2. The logic circuit of claim 1, wherein each of the at least one MOS transistor of the second differential stage has a gate terminal that constitutes an input to the logic circuit.

3. The logic circuit of claim 1, wherein the MOS transistor of the current source has a source terminal that is connected to a supply voltage.

4. The logic circuit of claim 1, wherein:
   the first differential stage includes two first differential stages, each of the two first differential stages having a first branch, a second branch, and an emitter terminal, each of the two first differential stages including a plurality of bipolar transistors operating in a linear mode, each of the first branches of the two first differential stages being connected together, each of the second branches of the two first differential stages being connected together;
   the second differential stage includes two MOS transistors, each of the two MOS transistors being connected to a respective one of the two first differential stages; and
   the logic circuit forms a multiplexer having a first input that includes complementary signal terminals respectively connected to the base terminals of two of the plurality of bipolar transistors of one of the two first differential stages, a second input that includes complementary signal terminals respectively connected to the base terminals of two of the plurality of bipolar transistors of the other of the two first differential stages, a third input that includes complementary signal terminals respectively connected to gate terminals of the MOS transistors of the second differential stage, and an output that includes two complementary output signal terminals respectively connected to the collector terminals of two of the plurality of bipolar transistors of the one of the two first differential stages.

5. The logic circuit of claim 1, wherein:
   the second differential stage includes a second branch that is coupled to the collector terminal of one of the bipolar transistors of the first differential stage; and
   the logic circuit forms a logic gate having a first input that includes complementary signal terminals respectively connected to the base terminals of two of the plurality of bipolar transistors, a second input that includes complementary signal terminals respectively connected to gate terminals of the MOS transistors of the second differential stage, and an output that includes two complementary output signal terminals respectively connected to the collector terminals of two of the plurality of bipolar transistors.

6. The logic circuit of claim 1, wherein:
   each of the plurality of bipolar transistors is an NPN transistor; and
   each of the at least one MOS transistor of the second differential stage is a N-channel transistor; and
   the MOS transistor of the current source is a N-channel transistor.

7. The logic circuit of claim 2, wherein:
   each of the plurality of bipolar transistors is an NPN transistor; and
   each of the at least one of MOS transistor of the second differential stage is a N-channel transistor; and
   the MOS transistor of the current source is a N-channel transistor.

8. The logic circuit of claim 3, wherein:
   each of the plurality of bipolar transistors is an NPN transistor; and
   each of the at least one MOS transistor of the second differential stage is a N-channel transistor; and
   the MOS transistor of the current source is a N-channel transistor.

9. The logic circuit of claim 4, wherein:
   each of the plurality of bipolar transistors is an NPN transistor; and
   each of the at least one MOS transistor of the second differential stage is a N-channel transistor; and
   the MOS transistor of the current source is a N-channel transistor.

10. The logic circuit of claim 5, wherein:
    each of the plurality of bipolar transistors is an NPN transistor; and
    each of the at least one MOS transistor of the second differential stage is a N-channel transistor; and
    the MOS transistor of the current source is a N-channel transistor.

11. An emitter coupled logic device comprising:
    a first differential stage including a first bipolar transistor having a collector, a base, and an emitter, and a second bipolar transistor having a collector, a base, and an emitter coupled to the emitter of the first bipolar transistor;
    a constant current source including a MOS transistor that couples the emitter of the first bipolar transistor to a reference voltage; and a second differential stage that couples the emitter of the first bipolar transistor to the constant current source, the second differential stage including a plurality of MOS transistors coupled together.

12. The emitter coupled logic device of claim 11, wherein the first bipolar transistor and the second bipolar transistor are each an NPN transistor, and wherein the MOS transistor is an NMOS transistor.

13. The emitter coupled logic device of claim 11, further comprising:

a first output stage coupled to the collector of the first bipolar transistor; and a second output stage coupled to the collector of the second bipolar transistor.

14. The emitter coupled logic device of claim 13, wherein: the first output stage includes:

a first output bipolar transistor having a collector coupled to a voltage source, a base coupled to the collector of the first bipolar transistor, and an emitter that represents an inverted output of the logic device; and a first MOS transistor having a first terminal coupled to a second voltage source, a second terminal coupled to the emitter of the first output bipolar transistor, and a gate terminal receiving a bias signal; and the second output stage includes:

a second output bipolar transistor having a collector coupled to a voltage source, a base coupled to the collector of the first bipolar transistor, and an emitter that represents a non-inverted output of the logic device; and a second MOS transistor having a first terminal coupled to a second voltage source, a second terminal coupled to the emitter of the second output bipolar transistor, and a gate terminal receiving the bias signal.

15. The emitter coupled logic device of claim 11, wherein the current source is constructed and arranged so that the first bipolar transistor and the second bipolar transistor are each operating in one of an off mode and a linear mode.

16. The emitter coupled logic device of claim 11, wherein:

the first differential stage includes two first differential stages, each of the two first differential stages having a first bipolar transistor having a collector, a base, and an emitter, and a second bipolar transistor having a collector, a base, and an emitter coupled to the emitter of the first bipolar transistor, the collectors of each of the first bipolar transistors being coupled together, the collectors of each of the second bipolar transistors being coupled together;

the emitter coupled logic device further comprising a second differential stage including:

a first MOS transistor having a first terminal coupled to the emitters of the first and second bipolar transistors of one of the two first differential stages, a second terminal coupled to the constant current source, and a gate terminal;

a second MOS transistor having a first terminal coupled to the emitters of the first and second bipolar transistors of another of the two first differential stages, a second terminal coupled to the constant current source, and a gate terminal;

wherein the emitter coupled logic device forms a multiplexer having a first input that includes complementary signal terminals respectively connected to the base terminals of the first and second bipolar transistors of the one of the two first differential stages, a second input that includes complementary signal terminals respectively connected to the base terminals of the first and second bipolar transistors of the another of the two first differential stages, a third input that includes complementary signal terminals respectively connected to the gate terminals of the first and second MOS transistors, and an output that includes complementary signal terminals respectively coupled to the collectors of the first and second bipolar transistors of the one of the two first differential stages.

17. The emitter coupled logic device of claim 11, further comprising a second differential stage including:

a first MOS transistor having a first terminal coupled to the emitters of the first and second bipolar transistors of the first differential stage, a second terminal coupled to the constant current source, and a gate terminal; and a second MOS transistor having a first terminal coupled to the collector of the second bipolar transistor, a second terminal coupled to the constant current source, and a gate terminal;

wherein the emitter coupled logic device forms a logic gate having a first input that includes complementary signal terminals respectively connected to the base terminals of the first and second bipolar transistors of, a second input that includes complementary signal terminals respectively connected to the gate terminals of the first and second MOS transistors, and an output that includes complementary signal terminals respectively coupled to the collectors of the first and second bipolar transistors.

18. The emitter coupled logic device of claim 11, wherein the base of the first bipolar transistor, the base of the second bipolar transistor, and a gate terminal of each of the plurality of MOS transistors each is responsive to a respective one of a plurality of signals, each of which has substantially a same voltage range.

19. A method of biasing a differential stage of an emitter coupled logic device, the differential stage including a plurality of bipolar transistors having emitter terminals coupled together, the method comprising the steps of:

coupling a MOS transistor to the differential stage;

coupling a second terminal of the MOS transistor to a first reference voltage;

providing a second reference voltage to a gate terminal of the MOS transistor, so that the MOS transistor sources current from the differential stage sufficient to keep the bipolar transistors of the differential stage in one of an off mode and a linear mode; and coupling a second differential stage including a plurality of MOS transistors between the differential stage and the MOS transistor.

20. The method of claim 19, further comprising a step of coupling a base of each of the plurality of bipolar transistors and a gate terminal of each of the plurality of MOS transistors to a respective one of a plurality of signals, each of which has substantially a same voltage range.

21. An improved emitter coupled logic device of the type having a first differential stage including a first bipolar transistor having an emitter and a second bipolar transistor having an emitter coupled to the emitter of the first bipolar transistor, the improved emitter coupled logic device further including a current source and a second differential stage coupled between the current source and the first differential stage, the improvement comprising:

a MOS transistor included in the current source;

wherein the second differential stage includes a plurality of MOS transistors coupled together.

22. The improved emitter coupled logic device of claim 21, wherein the MOS transistor has a gate terminal that receives a reference bias voltage, so that the MOS transistor sources current from the differential stage sufficient to keep the first bipolar transistor and the second bipolar transistor in one of an off mode and a linear mode.

23. The improved emitter coupled logic device of claim 21, wherein a base of the first bipolar transistor, a base of the second bipolar transistor, and a gate terminal of each of the plurality of MOS transistors each is responsive to a respective one of a plurality of signals, each of which has substantially a same voltage range.

24. An improved emitter coupled logic device of the type having a first differential stage including a first bipolar transistor having an emitter and a second bipolar transistor having an emitter coupled to the emitter of the first bipolar transistor, the improved emitter coupled logic device further including a constant current source and a second differential stage coupled between the current source and the first differential stage, the improvement comprising:
    a plurality of MOS transistors, coupled together, included in the second differential stage.

25. The improved emitter coupled logic device of claim 24, wherein the current source includes a MOS transistor.

26. The improved emitter coupled logic device of claim 25, wherein the MOS transistor of the current source has a gate terminal that receives a reference bias voltage, so that the MOS transistor sources current from the differential stage sufficient to keep the first bipolar transistor and the second bipolar transistor in one of an off mode and a linear mode.

27. The improved emitter coupled logic device of claim 24, wherein a base of the first bipolar transistor, a base of the second bipolar transistor, and a gate terminal of each of the plurality of MOS transistors each is responsive to a respective one of a plurality of signals, each of which has substantially a same voltage range.

28. An improved emitter coupled logic device of the type having a first differential stage including a first bipolar transistor having an emitter and a second bipolar transistor having an emitter coupled to the emitter of the first bipolar transistor, the improved emitter coupled logic device further including a constant current source and a second differential stage coupled between the current source and the first differential stage, the improved emitter coupled logic device having a minimum supply voltage by which the first bipolar transistor and the second bipolar transistor operate in a linear mode, the improvement comprising:
    means, contained within the second differential stage, for maintaining the first bipolar transistor and the second bipolar transistor in the linear mode while decreasing the minimum supply voltage.

29. The improved emitter coupled logic device of claim 28, wherein the means for maintaining comprises a plurality of MOS transistors coupled together.

30. The improved emitter coupled logic device of claim 29, wherein a base of the first bipolar transistor, a base of the second bipolar transistor, and a gate terminal of each of the plurality of MOS transistors each is responsive to a respective one of a plurality of signals, each of which has substantially a same voltage range.

31. An emitter coupled logic device comprising:
    a first differential stage including a first bipolar transistor having a collector, a base, and an emitter, and a second bipolar transistor having a collector, a base, and an emitter coupled to the emitter of the first bipolar transistor; and
    a constant current source including a MOS transistor that couples the emitter of the first bipolar transistor to a reference voltage;

wherein the first differential stage includes two first differential stages, each of the two first differential stages having a first bipolar transistor having a collector, a base, and an emitter, and a second bipolar transistor having a collector, a base, and an emitter coupled to the emitter of the first bipolar transistor, the collectors of each of the first bipolar transistors being coupled together, the collectors of each of the second bipolar transistors being coupled together;

and wherein the emitter coupled logic device further comprises a second differential stage including:
    a first MOS transistor having a first terminal coupled to the emitters of the first and second bipolar transistors of one of the two first differential stages, a second terminal coupled to the constant current source, and a gate terminal; and
    a second MOS transistor having a first terminal coupled to the emitters of the first and second bipolar transistors of another of the two first differential stages, a second terminal coupled to the constant current source, and a gate terminal;

wherein the emitter coupled logic device forms a multiplexer having a first input that includes complementary signal terminals respectively connected to the base terminals of the first and second bipolar transistors of the one of the two first differential stages, a second input that includes complementary signal terminals respectively connected to the base terminals of the first and second bipolar transistors of the another of the two first differential stages, a third input that includes complementary signal terminals respectively connected to the gate terminals of the first and second MOS transistors, and an output that includes complementary signal terminals respectively coupled to the collectors of the first and second bipolar transistors of the one of the two first differential stages.

32. The emitter coupled logic device of claim 31, wherein the first input is responsive to a first pair of signals, the third input is responsive to a second pair of signals, and each of the first pair and second pair of signals has substantially a same voltage range.

33. An emitter coupled logic device comprising:
    a first differential stage including a first bipolar transistor having a collector, a base, and an emitter, and a second bipolar transistor having a collector, a base, and an emitter coupled to the emitter of the first bipolar transistor;
    a constant current source including a MOS transistor that couples the emitter of the first bipolar transistor to a reference voltage; and
    a second differential stage including:
        a first MOS transistor having a first terminal coupled to the emitters of the first and second bipolar transistors of the first differential stage, a second terminal coupled to the constant current source, and a gate terminal; and
        a second MOS transistor having a first terminal coupled to the collector of the second bipolar transistor, a second terminal coupled to the constant current source, and a gate terminal;

wherein the emitter coupled logic device forms a logic gate having a first input that includes complementary signal terminals respectively connected to the base terminals of the first and second bipolar transistors of, a second input that includes complementary signal terminals respectively connected to the gate terminals of the first and second MOS transistors, and an output that includes complementary signal terminals respectively coupled to the collectors of the first and second bipolar transistors.

34. The emitter coupled logic device of claim 33, wherein the first input is responsive to a first pair of signals, the third input is responsive to a second pair of signals, and each of the first pair and second pair of signals has substantially a same voltage range.

* * * * *